United States Patent
Lin et al.

(10) Patent No.: US 10,408,880 B2
(45) Date of Patent: Sep. 10, 2019

(54) TECHNIQUES FOR ROBUST BATTERY STATE ESTIMATION

(71) Applicants: Jian Lin, Beverly Hills, MI (US); Hong Yang, Rochester Hills, MI (US); Pawel Malysz, Hamilton (CA); Jin Ye, Hamilton (CA); Ran Gu, Hamilton (CA); Ali Emadi, Burlington (CA)

(72) Inventors: Jian Lin, Beverly Hills, MI (US); Hong Yang, Rochester Hills, MI (US); Pawel Malysz, Hamilton (CA); Jin Ye, Hamilton (CA); Ran Gu, Hamilton (CA); Ali Emadi, Burlington (CA)

(73) Assignee: FCA US LLC, Auburn Hills, MI (US)

( * ) Notice: Subject to any disclaimer, the term of this patent is extended or adjusted under 35 U.S.C. 154(b) by 1155 days.

(21) Appl. No.: 14/463,016

(22) Filed: Aug. 19, 2014

(65) Prior Publication Data
US 2016/0054390 A1    Feb. 25, 2016

(51) Int. Cl.
| | | |
|---|---|---|
| G01R 31/36 | (2019.01) | |
| G01R 31/367 | (2019.01) | |
| B60L 58/10 | (2019.01) | |
| G01R 31/392 | (2019.01) | |
| G01R 31/3842 | (2019.01) | |

(52) U.S. Cl.
CPC .......... G01R 31/367 (2019.01); B60L 58/10 (2019.02); G01R 31/3842 (2019.01); G01R 31/392 (2019.01); Y02T 10/705 (2013.01); Y02T 10/7005 (2013.01)

(58) Field of Classification Search
CPC ............ G01R 31/3651; G01R 31/3679; G01R 31/3624; G01R 31/3606; G01R 31/3648; G01R 31/3662; B06L 11/1851; Y02E 60/12
See application file for complete search history.

(56) References Cited

U.S. PATENT DOCUMENTS

| | | | |
|---|---|---|---|
| 7,109,685 | B2 | 9/2006 | Tate, Jr. et al. |
| 7,250,741 | B2 | 7/2007 | Koo et al. |
| 7,321,220 | B2 | 1/2008 | Plett |
| 7,518,339 | B2 | 4/2009 | Schoch |
| 7,656,122 | B2 | 2/2010 | Plett |
| 7,969,120 | B2 | 6/2011 | Plett |

(Continued)

*Primary Examiner* — Sujoy K Kundu
*Assistant Examiner* — L. Anderson
(74) *Attorney, Agent, or Firm* — Ralph E. Smith (57) ABSTRACT

More accurate and robust battery state estimation (BSE) techniques for a battery system of an electrified vehicle include estimating a current bias or offset generated by a current sensor and then adjusting the measured current to compensate for the estimated current bias. The techniques obtain nominal parameters for a battery model of the battery system based on a measured temperature and an estimated open circuit voltage (OCV). The techniques use these nominal parameters and the corrected measured current to estimate the OCV, a capacity, and an impedance of the battery system. The techniques utilize the OCV to estimate a state of charge (SOC) of the battery system. The techniques also estimate a state of health (SOH) of the battery system based on its estimated capacity and impedance. The techniques then control the electrified vehicle based on the SOC and/or the SOH.

14 Claims, 4 Drawing Sheets

(56) References Cited

U.S. PATENT DOCUMENTS

| | | | | |
|---|---|---|---|---|
| 2010/0318252 A1* | 12/2010 | Izumi | ................... | B60W 20/13 |
| | | | | 701/22 |
| 2014/0092375 A1* | 4/2014 | Raghavan | ............... | G01L 1/246 |
| | | | | 356/32 |
| 2014/0358459 A1* | 12/2014 | Trnka | ................ | G01R 31/3651 |
| | | | | 702/63 |
| 2017/0096077 A1* | 4/2017 | Li | ...................... | B60L 11/1864 |

* cited by examiner

TECHNIQUES FOR ROBUST BATTERY STATE ESTIMATION

FIELD

The present disclosure relates generally to electrified vehicles and, more particularly, to techniques for robust battery state estimation.

BACKGROUND

Battery state estimation (BSE) is a primary function of a battery management system of an electrified vehicle (EV). Major functions of BSE are state of charge (SOC) estimation, state of health (SOH) estimation, state of power (SOP) estimation, and impedance estimation. SOC represents a current amount (e.g., a percentage) of a charge capacity that is currently being stored by the battery system. SOH represents a current age (e.g., a percentage of a full life) of the battery system. SOP represents a peak power of the battery system. Impedance represents an internal resistance of the battery system. Conventional battery management or BSE systems potentially do not accurately estimate SOC, SOH, SOP, and impedance. One cause of this potentially inaccurate estimation of SOC, SOH, SOP, and impedance is a current, voltage, and/or temperature measurement for the battery system that is potentially inaccurate. Thus, while such battery management or BSE systems work for their intended purpose, there remains a need for improvement in the relevant art.

SUMMARY

In one aspect, a method is provided in accordance with the teachings of the present disclosure. In an exemplary implementation, the method includes receiving, at a controller of an electrified vehicle, measurements of current, voltage, and temperature of a battery system of the electrified vehicle, the measured current being obtained by a current sensor. The method includes obtaining, at the controller, nominal parameters for an equivalent circuit model of the battery system based on the measured current, voltage, and temperature. The method includes estimating, at the controller, a current bias generated by the current sensor based on the measured voltage and the nominal parameters for the battery system. The method includes adjusting, at the controller, the measured current based on the estimated current bias to obtain a corrected measured current. The method includes estimating, at the controller, an open circuit voltage (OCV) of the battery system based on the measured voltage, the nominal parameters at the measured temperature, and the corrected measured current. The method also includes estimating, at the controller, a state of charge (SOC) of the battery system based on the estimated OCV of the battery system, wherein the nominal parameters are obtained based further on a transformed OCV based on the estimated SOC.

In another aspect, an electrified vehicle is provided in accordance with the teachings of the present disclosure. In an exemplary implementation, the electrified vehicle includes an electric motor configured to propel the electrified vehicle, a battery system configured to power the electric motor, a current sensor configured to measure a current of the battery system, and a controller. The controller is configured to: receive the measured current from the current sensor; receive measured voltage of the battery system and measured temperature of the battery system; obtain nominal parameters for an equivalent circuit model of the battery system based on the measured current, voltage, and temperature; estimate a bias or offset of the current sensor based on the measured voltage and the nominal parameters for the battery system; adjust the measured current based on the estimated bias or offset of the current sensor to obtain a corrected measured current; estimate an OCV of the battery system based on the measured voltage, the nominal parameters at the measured temperature, and the corrected measured current; and estimate an SOC of the battery system based on the estimated OCV of the battery system; wherein the nominal parameters are obtained based further on a transformed OCV based on the estimated SOC.

In one exemplary implementation, calculating the current bias generated by the current sensor includes: detecting, at the controller, a low current period during which the measured current is less than a predetermined threshold; converting, at the controller, the equivalent circuit model from a continuous-time domain to a discrete-time domain to obtain state-space matrices for the measured current; and in response to detecting the low current period, applying, at the controller, a Kalman filter (KF) algorithm to the state-space matrices to estimate the current bias of the current sensor.

In one exemplary implementation, based on the measured voltage, the nominal parameters, and the corrected measured current, the controller is configured to estimate at least one of (i) a capacity of the battery system and (ii) an impedance of the battery system. In one exemplary implementation, the controller is configured to estimate a state of health (SOH) of the battery system based on its capacity and its impedance.

In one exemplary implementation, the controller is configured to perform, as a function of the estimated SOC, recursive (i) obtaining of the nominal parameters and (ii) estimation of the OCV, the capacity, and the impedance. In one exemplary implementation, estimating the SOC based on the estimated OCV includes utilizing an OCV-SOC curve model, where the function is a ratio of (i) change in OCV to (ii) change in SOC.

In one exemplary implementation, estimating each of the OCV, the capacity, and the impedance based on the measured voltage, the nominal parameters at the measured temperature, and the corrected measured current further includes: performing, at the controller, an LDL factorization to enhance each respective estimation algorithm; and utilizing, at the controller, each enhanced respective estimation algorithm with the measured voltage, the nominal parameters, and the corrected measured current to obtain the estimated OCV, the estimated capacity, and the estimated impedance. In one exemplary implementation, each respective estimation algorithm is one of (i) a recursive least squares (RLS) adaptive filter algorithm, (ii) a Kalman filter (KF) algorithm, and (iii) an extended KF (EKE) algorithm.

In one exemplary implementation, the controller is configured to utilize a look-up table relating values of the nominal parameters for the battery system to the measured temperature and SOC of the battery system. In one exemplary implementation, the controller is configured to apply predetermined constraints or ranges to the values of the nominal parameters for the battery system. In one exemplary implementation, the nominal parameters include at least one of capacity, resistance, and capacitance of the battery system. In one exemplary implementation, at least some of the nominal parameters are asymmetric for charging and discharging of the battery system.

In one exemplary implementation, the controller is configured to control at least one of the battery system and the electric motor based on the estimated SOC of the battery system. In one exemplary implementation, the controller is configured to control at least one of the battery system and the electric motor based on the estimated SOH of the battery system.

Further areas of applicability of the teachings of the present disclosure will become apparent from the detailed description, claims and the drawings provided hereinafter, wherein like reference numerals refer to like features throughout the several views of the drawings. It should be understood that the detailed description, including disclosed embodiments and drawings referenced therein, are merely exemplary in nature intended for purposes of illustration only and are not intended to limit the scope of the present disclosure, its application or uses. Thus, variations that do not depart from the gist of the present disclosure are intended to be within the scope of the present disclosure.

DESCRIPTION

As previously mentioned, inaccurate current sensor measurement could potentially cause inaccurate battery state estimation (BSE). Example causes of the inaccurate current sensor measurement include sensor gain error and offset error due to a hysteresis effect. For example only, a Hall effect current sensor could have 1-3% of gain error in addition to the offset error due to the hysteresis effect, which could produce measurement errors in the range of 150-500 milliamps (mA). These current measurement errors then propagate through the BSE algorithms thereby potentially causing estimation errors.

Conventional BSE systems do not account for this potential current bias or offset. Secondly, conventional BSE systems, such as those utilizing single floating point precision algorithms to estimate battery system parameters in real-time, are also potentially at risk for estimation instability due to numerical issues, model structure uncertainty, and/or measurement uncertainty. Lastly, conventional estimation algorithms also pre-screen or filter nominal battery model parameters to avoid negative or impossible physical values, which increases processor throughput thereby potentially causing estimation delay. Estimation delay could also cause estimation inaccuracy in real-time.

Accordingly, more accurate and robust BSE techniques are presented in accordance with various aspects of the present disclosure. These more accurate and robust BSE techniques provide for improved (e.g., maximum) usage of the battery system, which allows for decreased size/weight of the battery system. The techniques include estimating a current bias or offset generated by a current sensor and then adjusting the measured current to compensate for the estimated current bias. The techniques also include obtaining nominal parameters (resistance, capacitance, capacity, etc.) for a battery model of the battery system based on a measured temperature. In some implementations, constraints or ranges are applied to the nominal parameters to prevent negative or impossible physical values.

These nominal parameters, the measured voltage, and the corrected measured current are then used in estimating an open circuit voltage (OCV), a capacity, and an impedance of the battery system. In one exemplary implementation, a state of health (SOH) of the battery system is estimated based on its estimated capacity and impedance. The techniques utilize the OCV to estimate a state of charge (SOC) of the battery system. In one exemplary implementation, an OCV-SOC curve model is utilized to obtain the estimated SOC. A recursive process could also be performed that, based on a function of the SOC, adjusts the nominal parameters, the OCV, the capacity, and/or the impedance. In one exemplary implementation, the function includes a transform of the SOC and/or a ratio of a change in OCV to a change in SOC, such as a derivative of the OCV-SOC curve model.

Figure 1:
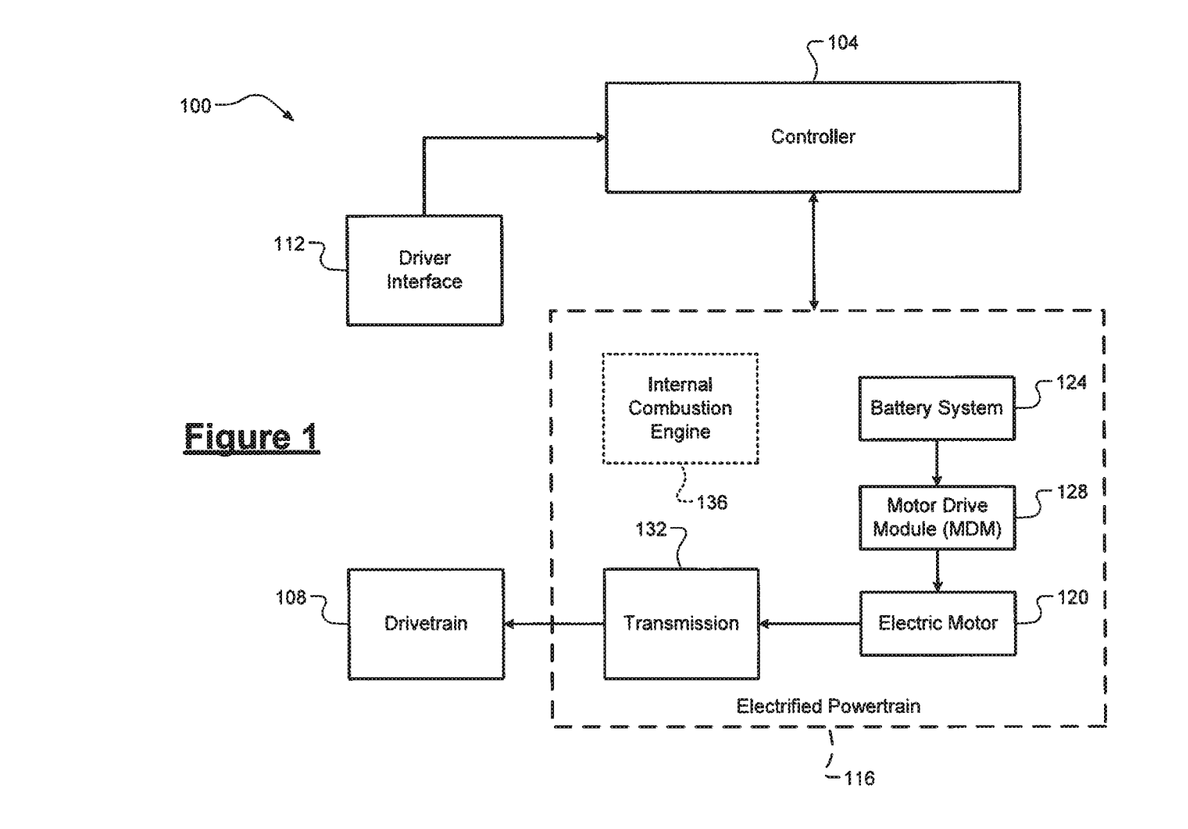
FIG. 1 is an example functional block diagram of an electrified vehicle (EV) according to the principles of the present disclosure.

Referring now to FIG. 1, a functional block diagram of an electrified vehicle (EV) 100 is illustrated. Examples of the electrified vehicle 100 include a battery electric vehicle (BEV), an extended-range electric vehicle (EREV), a fuel cell electric vehicle (FCEV), and a hybrid electric vehicle (HEV) such as a plug-in HEV (PHEV) and a non-plug-in HEV. The electrified vehicle 100 could also be another suitable electrified vehicle. The electrified vehicle 100 includes a controller 104 that controls operation of the electrified vehicle 100. Specifically, the controller 104 controls drive torque supplied to a drivetrain 108 (one or more wheels, a differential, etc.) in response to a torque request via a driver interface 112. The driver interface 112 is one or more devices configured to allow a driver of the electrified vehicle 100 to input a vehicle torque request, e.g., an accelerator pedal. The drive torque is supplied to the drivetrain 108 from an electrified powertrain 116. While the discussion will continue with reference to the controller 104, it will be appreciated that one or more controllers, control modules, and/or electronic control systems could be utilized.

The electrified powertrain 116 is a high power electrified powertrain capable of generating enough drive torque to propel the electrified vehicle 100. In one exemplary implementation, the electrified powertrain 116 for a BEV includes an electric motor 120, a battery system 124, a motor drive module (MDM) 128, and a transmission 132. The transmission 132 transfers drive torque generated by the electric motor 120 to the drivetrain 108. Examples of the electric motor 120 are synchronous electric motors and induction (asynchronous) electric motors. In some implementations (EREV, HEV, etc.), the electrified powertrain 116 could optionally include an internal combustion engine 136. The internal combustion engine 136 combusts a mixture of air and fuel, e.g., gasoline, within cylinders to rotatably drive a crankshaft and generate drive torque. In one implementation, the internal combustion engine 136 is coupled to an electrically variable transmission (EVT) 132 utilizing two electric motors 120 and is utilized to both provide motive power and recharge the battery system 124, e.g., during driving of the electrified vehicle 100.

Figure 2:
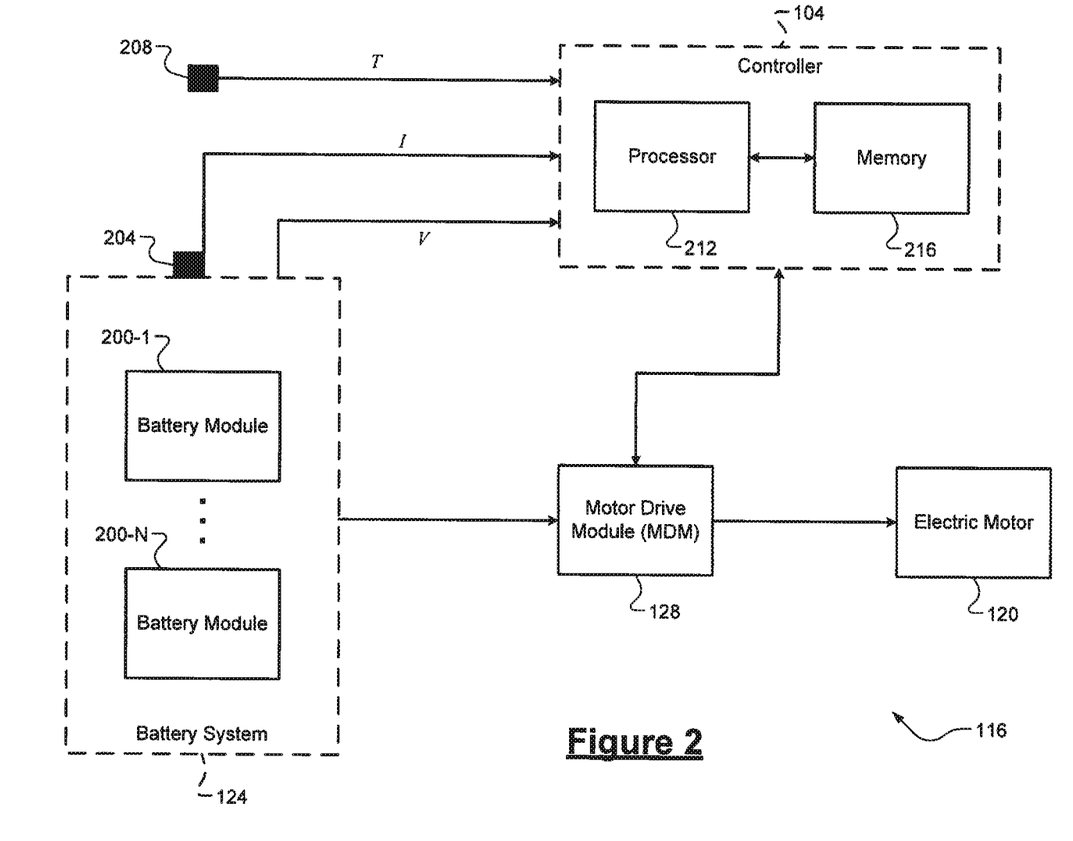
FIG. 2 is an example functional block diagram of a battery system of the EV according to the principles of the present disclosure.

Referring now to FIG. 2, an example functional block diagram of the electrified powertrain 116 is illustrated. The battery system 124 includes a plurality of battery modules 200-1 . . . 200-N (N>1; collectively "battery modules 200"). Each battery module 200 is configured to generate and output a low direct current (DC) voltage. For example, each battery module 200 could include at least one lithium ion (Li-ion) cell, each Li-ion cell having a voltage of approximately four Volts DC. The battery system 124 is configured to generate and output a DC voltage based on some combination of the battery modules 200. The MDM 128 is configured to obtain one or more alternating current (AC) voltages for the electric motor 120. For example, different phase-shifted AC voltages could be applied to different coils/windings/stators (not shown) of the electric motor 120, which could cause a rotor (not shown) of the electric motor 120 to rotate and generate drive torque. Example components of the MDM 128 include transistors, capacitors, a DC-DC converter, and an inverter.

Figure 3:
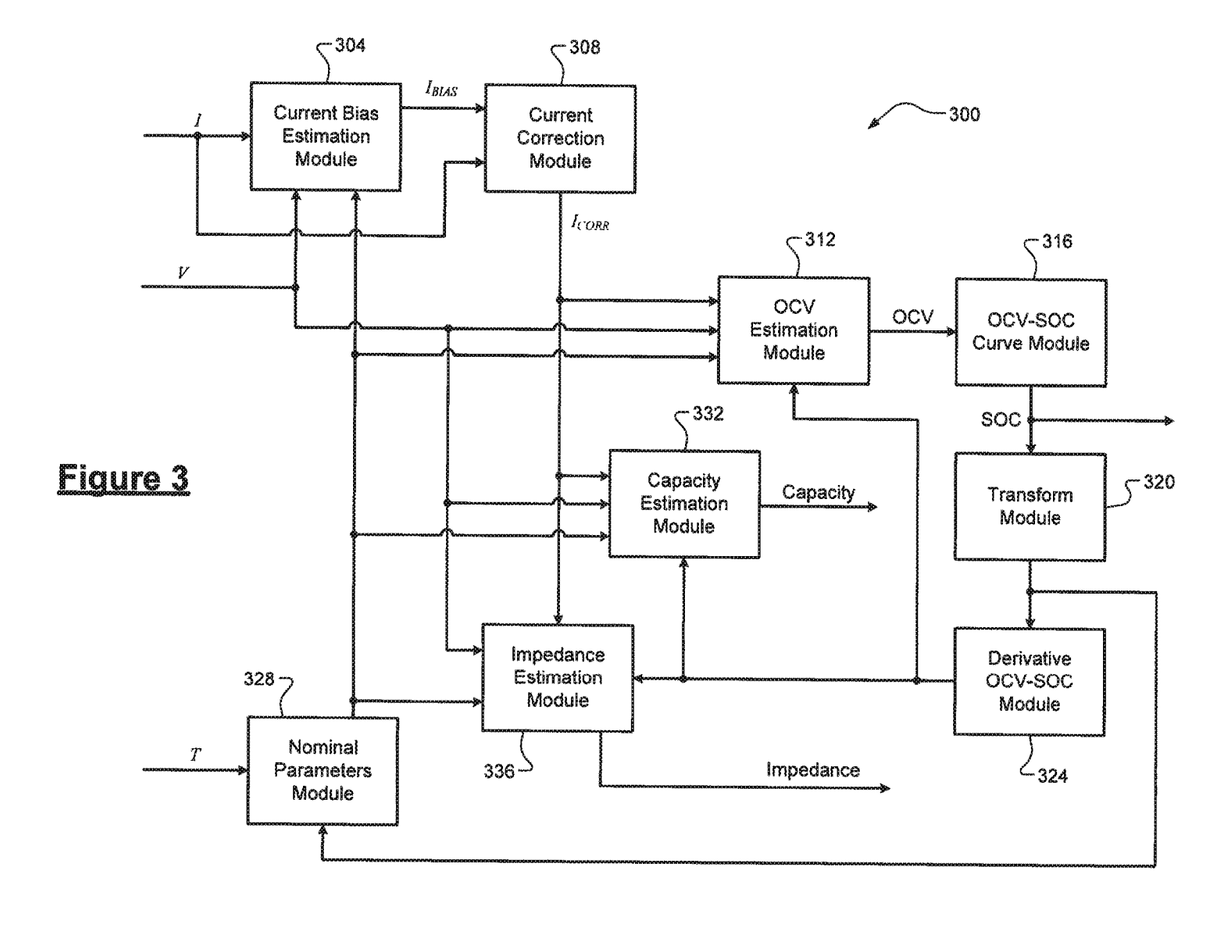
FIG. 3 is an example battery state estimation (BSE) architecture according to the principles of the present disclosure.

A current sensor 204 is configured to measure a current (I) of the battery system 124. In one exemplary implementation, the current sensor 204 is a Hall effect sensor. A temperature sensor 208 is configured to measure a temperature (T) associated with the battery system 124. The current I and the temperature T are provided to the controller 104. The controller 104 also receives a voltage (V) of the battery system 124. For example, the voltage V could be measured using a voltage sensor. In one exemplary implementation, the controller 104 includes a processor 212 and a memory 216 that are collectively utilized to execute the BSE architecture as shown in FIG. 3 and described in greater detail below. It will be appreciated that the term "processor" as used herein refers to both a single processor and a plurality of processors operating in a parallel or distributed architecture.

It will be appreciated that the configuration of the electrified powertrain 116 could be different than illustrated in FIG. 2. More specifically, in one exemplary implementation the battery system 124 could include a battery management system (separate from the controller 104) that is configured to perform at least a portion of the techniques of the present disclosure. For example, the battery management system could perform the SOC estimation. In this exemplary configuration, the battery management system could receive the measured parameters (e.g., current, voltage, and temperature). It will also be appreciated that other configurations of the electrified powertrain 116 could be implemented that also implement the techniques of the present disclosure.

Referring now to FIG. 3, an example functional block diagram of a BSE architecture 300 for the controller 104 is illustrated. As mentioned above, in one exemplary implementation the BSE architecture 300 is implemented and executed by the processor 212 and the memory 216. The BSE architecture 300 includes a current bias estimation module 304, a current correction module 308, an OCV estimation module 312, an OCV-SOC curve module 316, a transform module 320, a derivative OCV-SOC module 324, a nominal parameters module 328, a capacity estimation module 332, and an impedance estimation module 336. In one exemplary implementation, the term "module" as used herein refers to a set of instructions that are executable by the processor 212 in conjunction with the memory 216.

The nominal parameters module 328 obtains nominal parameters for an equivalent circuit model of the battery system 124 based on the measured temperature T and transformed OCV based on estimated SOC. In one exemplary implementation, the nominal parameters module 328 is a lookup table stored at the memory 212 that relates the measured temperature T and transformed OCV based on estimated SOC to various nominal parameters for the equivalent circuit model of the battery system 124. The equivalent circuit model could have symmetric parameters (i.e., the same for charging and discharging of the battery system 124) or asymmetric parameters (i.e., different parameters for charging and discharging of the battery system 124). Thus, another input to the nominal parameters module 328 could be an input indicative of a current state (charging or discharging) of the battery system 124.

The parameters and their symmetry depend on the type of equivalent circuit model used to model the battery system 124. In one exemplary implementation, the equivalent circuit model has an OCV, an ohmic resistance ($R_o$), and an RC pair ($R_a$, $C_a$), which is also referred to as a 1RC equivalent circuit model. The parameters could be obtained offline based on test data. During operation (online), however, the parameters are obtained by the nominal parameters module 328 based on the measured temperature T and an estimated SOC based on a transformed OCV estimate. In one exemplary implementation, the nominal parameters module 328 applies constraints or ranges to the lookup table to prevent negative or impossible nominal parameters from affecting estimation by the BSE architecture 300. Examples of the nominal parameters include resistance, capacitance, and capacity.

The current bias estimation module 304 receives the measured current I, the measured voltage V, and the nominal parameters (R, C, Cap, etc.). The current bias estimation module 304 estimates a current bias or offset ($I_{BIAS}$) generated by the current sensor 204 based on these inputs. In one exemplary implementation, the current bias estimation module 304 converts the equivalent circuit model from a continuous-time domain to a discrete-time domain. Doing so allows the current bias estimation module 304 to obtain state-space matrices for the measured current I. The current bias estimation module 304 then applies an algorithm, such as a Kalman filter (KF) algorithm to the state-space matrices to obtain the estimated current bias $I_{BIAS}$.

In one exemplary implementation, the current bias estimation module 304 first detects a low current period during which the measured current I is less than a predetermined threshold. This low current period could be sufficiently long to provide a stable low current. For example only, the low current period could be approximately five minutes. In response to detecting the low current period, the current bias estimation module 304 could then apply the KF filter algorithm to the state-space matrices to obtain the estimated current bias $I_{BIAS}$. This low current requirement is implemented because the KF algorithm could potentially be more accurate for low currents, particularly when the current bias $I_{BIAS}$ is assumed to be constant.

In one exemplary implementation, the discrete-time domain representation of the measured current I is modeled as follows:

$$I_k = \frac{1}{R_o}\left(V_{OC,k} - \frac{R_a}{R_a + R_o}v_k - V_k\right) + I_{BIAS}, \quad (1)$$

$$y_k = I_k, \quad (2)$$

$$x_k = \begin{bmatrix} v_k \\ V_{OC,k} \\ I_{BIAS} \end{bmatrix}, \quad (3)$$

$$u_k = V_k, \text{ and} \quad (4)$$

$$v_k = V_{a,k}\frac{R_a}{R_a + R_o}. \quad (5)$$

In this model, $y_k$, $x_k$, and $u_k$ represent the input, output, and the states, respectively, and $v_k$ represents an internal state to be estimated, and k represents a sample number.

Continuing with the model above, in one exemplary implementation the state-space matrices used for estimation of the current bias $I_{BIAS}$ are as follows:

$$A_k = \begin{bmatrix} \alpha & (1-\alpha) & 0 \\ \dfrac{R_a}{R_a + R_o}\zeta & (1-\zeta) & 0 \\ 0 & 0 & 1 \end{bmatrix}, \quad (6)$$

$$B_k = \begin{bmatrix} (\alpha - 1) \\ \zeta \\ 0 \end{bmatrix}, \quad (7)$$

$$C_k = \begin{bmatrix} \dfrac{-1}{R_o} & \dfrac{R_a}{R_a + R_o} & \dfrac{1}{R_o} & 1 \end{bmatrix}, \text{ and} \quad (8)$$

$$D_k = \begin{bmatrix} \dfrac{-1}{R_o} \end{bmatrix}. \quad (9)$$

In the above:

$$\alpha = e^{\frac{\Delta t(R_a + R_o)}{C_a R_a R_o}}, \text{ and} \quad (10)$$

$$\zeta = \frac{dV_{OC}}{dSOC} \cdot \frac{\Delta t}{CAP} \cdot \frac{1}{R_o}, \quad (11)$$

where $V_{OC}$ is the OCV, t is time, and CAP is capacity. The KF algorithm is then used to estimate the current bias $I_{BIAS}$ based on the state-space matrices above.

The current correction module 308 receives the estimated current bias $I_{BIAS}$ and the measured current I. Based on these values, the current correction module 308 obtains a corrected measured current $I_{CORR}$. In one exemplary implementation, the current correction module 308 subtracts the estimated bias current $I_{BIAS}$ from the measured current I to obtain the corrected measured current $I_{CORR}$. It will be appreciated, however, that other processing could also be performed by the current correction module 308, such as scaling one or more of the current values. The current correction module 308 then provides the corrected measured current $I_{CORR}$ to each of the OCR estimation module 312, the capacity estimation module 332, and the impedance estimation module 336.

The OCV estimation module 312 estimates the OCV of the battery system 124 (also referred to as $V_{OC}$) based on the corrected measured current $I_{CORR}$, the measured voltage V, and the nominal parameters. In one exemplary implementation, the OCV is estimated using the state $V_{OC}$ as discussed above with respect to the equivalent circuit model and Equations 1-11. The OCV-SOC curve module 316 receives the estimated OCV from the OCV estimation module 312 and estimates the SOC of the battery system 124 based on the estimated OCV. In one exemplary implementation, the OCV-SOC curve module utilizes a known OCV-SOC curve model stored at the memory 212 to obtain the SOC from the OCV. The estimated SOC is then utilized by the controller 104 as discussed in greater detail below.

Similar to the OCV and SOC estimation above, the capacity estimation module 332 and the impedance estimation module 336 estimate a capacity (or CAP) of the battery system 124 and an impedance of the battery system, respectively. These estimations are also based on the corrected measured current $I_{CORR}$, the measured voltage V, and the nominal parameters. In one exemplary implementation, the controller 104 utilizes the capacity and the impedance to estimate the SOH of the battery system 124. Similar to the estimated SOC, the estimated SOH is then utilized by the controller as discussed in greater detail below.

The following represents a recursive process. The transform module 320 also receives the estimated SOC and performs a transform of the SOC. In one exemplary implementation, the transform is a unit delay Z-transform (1/Z). The transformed estimated SOC is provided to both the derivative OCV-SOC module 324 and the nominal parameters module 328. The nominal parameters module 328 could obtain updated nominal parameters based on the transformed estimated SOC as feedback, and these updated nominal parameters could affect the next series of OCV, capacity, and impedance estimations. The derivative OCV-SOC module 324 calculates a ratio of (i) a change in the OCV to (ii) a change in the SOC, e.g., with respect to time. This ratio is also referred to as ΔOCV/ΔSOC. In one exemplary implementation, this ratio could represent a derivative of the OCV-SOC curve model as discussed previously herein.

Each of the OCV estimation module 312, the capacity estimation module 332, and the impedance estimation module 336 also receives the ratio for use in estimating their corresponding parameters. Each of these modules 312, 332, 336 could utilize a suitable estimation algorithm to estimate its respective parameter. Examples of these estimation algorithms include a recursive least squares (RLS) adaptive filter algorithm (or "RLS algorithm"), a KF algorithm, and an extended KF (EKF) algorithm. In one exemplary implementation, at least one of these modules 312, 332, and 336 performs an LD (or LDL) factorization to enhance its respective estimation algorithm. As is well understood in the art of solving linear equations, LD factorization involves a decomposition of a matrix into a lower unit triangular matrix (L) and a diagonal matrix (D).

Referring again to FIG. 2 and with continued reference to FIG. 3, as briefly mentioned above, the controller 104 is configured to utilize the estimated SOC and/or the estimated SOH. In one exemplary implementation, the controller 104 is configured to control at least one of (i) the battery system 124 and (ii) the electric motor 120 based on at least one of the estimated SOC, SOP, and the estimated SOH. The controller 104 could also be configured to similarly control the MDM 128. Example control by the controller 104 could include increasing or decreasing a current provided to the electric motor 120 from the battery system 124 via the MDM 128. For example, the estimated SOC or the estimated SOH could be larger than other estimations, thereby providing for improved capability of the electrified vehicle 100.

Figure 4:
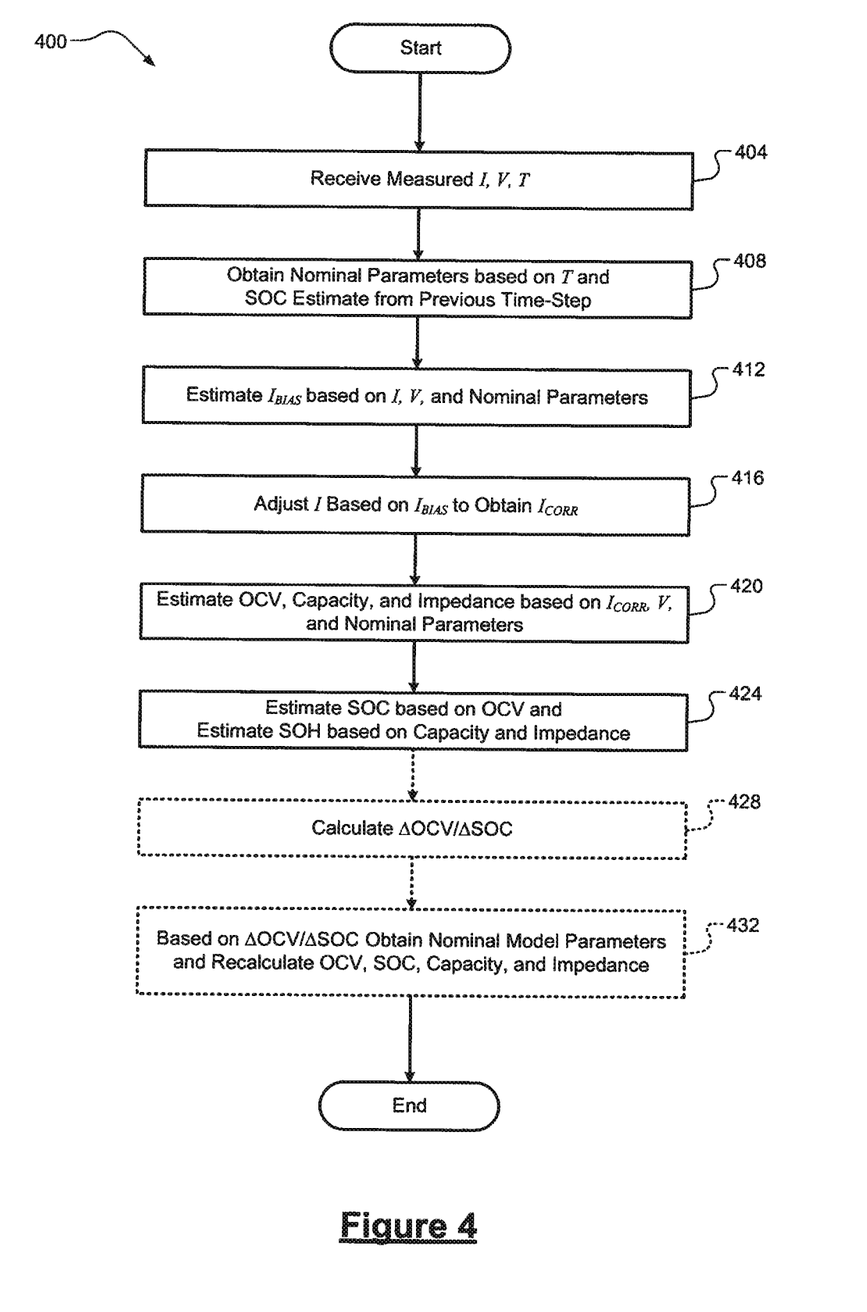
FIG. 4 is an example flow diagram of a method for robust BSE according to the principles of the present disclosure.

Referring now to FIG. 4, an example flow diagram of a method 400 for robust BSE is illustrated. At 404, the controller 104 receives measurements for the current (I), voltage (V), and temperature (T) of the battery system 124. In one exemplary implementation, the measured current I and the measured temperature T are received from the current sensor 204 and the temperature sensor 208, respectively. At 408, the controller 104 obtains nominal parameters for the battery system 124 based on the measured temperature and an old SOC estimate from the previous time-step. Examples of these nominal parameters include resistance, capacitance, and capacity. In one exemplary implementation, the nominal parameters are obtained based on the measured temperature T using a look-up table stored at the memory 216. At 412, the controller 104 estimates the current bias ($I_{BIAS}$) based on the measured current I, the measured voltage V, and the nominal parameters.

At 416, the controller 104 adjusts the measured current I based on the estimated current bias $I_{BIAS}$ to obtain a corrected measured current $I_{CORR}$. In one exemplary implementation, the controller 104 subtracts the estimated current bias $I_{BIAS}$ from the measured current I to obtain the corrected measured current $I_{CORR}$. At 420, based on the corrected measured current $I_{CORR}$, the measured voltage V, and the nominal parameters, the controller 104 estimates (i) the OCV for the battery system 124, (ii) the capacity of the battery system 124, and (iii) the impedance of the battery system 124. At 424, the controller 104 estimates (i) the SOC of the battery system 124 based on the estimated OCV and (ii) the SOH of the battery system 124 based on the capacity and impedance of the battery system 124. In one exemplary implementation, the controller 104 estimates the SOC of the battery system 124 using an OCV-SOC curve model stored at the memory 216. The method 400 then ends or, optionally, proceeds to 428 to perform the following recursive process.

At 428, the controller 104 (optionally) calculates a ratio of (i) a change in the estimated OCV of the battery system 124 to (ii) a change in the estimated SOC of the battery system 124 ($\Delta OCV/\Delta SOC$). In one exemplary implementation, this ratio is calculated by calculating a derivative of the OCV-SOC curve model stored in the memory 216. At 432, based on the ratio $\Delta OCV/\Delta SOC$, the controller 104 (optionally) obtains (new) nominal model parameters and then re-estimates (i) the OCV of the battery system 124, (ii) the capacity of the battery system 124, and (iii) the impedance of the battery system 124. Similarly, the controller 104 could then (optionally) re-estimate the SOC of the battery system 124 and the SOH of the battery system 124 based on these new estimated parameters. The method 400 then ends or returns to 404 or 428 for one or more additional cycles.

It should be understood that the mixing and matching of features, elements, methodologies and/or functions between various examples may be expressly contemplated herein so that one skilled in the art would appreciate from the present teachings that features, elements and/or functions of one example may be incorporated into another example as appropriate, unless described otherwise above.

What is claimed is:

1. A method, comprising:
   receiving, at a controller of an electrified vehicle, measurements of current, voltage, and temperature of a battery system of the electrified vehicle, the measured current being obtained by a current sensor;
   obtaining, at the controller, a set of parameters for an equivalent circuit model of the battery system based on the measured current, voltage, and temperature, the set of parameters including at least one of resistance, capacitance, and capacity;
   detecting, at the controller, a low current period during which the measured current is less than a predetermined threshold and having a duration that is sufficiently long to provide a stable low current such that a current bias generated by the current sensor is assumed to be constant;
   in response to detecting the low current period:
      converting, at the controller, the equivalent circuit model from a continuous-time domain to a discrete-time domain to obtain state-space matrices for the measured current, and
      applying, at the controller, a Kalman filter (KF) algorithm to the state-space matrices to estimate the current bias generated by the current sensor based on the measured voltage and the set of parameters;
   adjusting, at the controller, the measured current based on the estimated current bias to obtain a corrected measured current;
   estimating, at the controller, an open circuit voltage (OCV) of the battery system based on the measured voltage, the set of parameters, and the corrected measured current;
   estimating, at the controller, a state of charge (SOC) of the battery system based on the estimated OCV of the battery system; and
   controlling, by the controller, at least one of the battery system and an electric motor of the electrified vehicle based on the estimated SOC, thereby compensating for the estimated current bias generated by the current sensor and improving usage of the battery system.

2. The method of claim 1, further comprising, based on the measured voltage, the set of parameters, and the corrected measured current, estimating, at the controller, at least one of (i) a capacity of the battery system and (ii) an impedance of the battery system.

3. The method of claim 2, further comprising estimating, at the controller, a state of health (SOH) of the battery system based on its capacity and its impedance.

4. The method of claim 3, further comprising controlling, by the controller, at least one of the battery system and an electric motor of the electrified vehicle based on the estimated SOH of the battery system.

5. The method of claim 2, further comprising, as a function of the estimated SOC, performing, at the controller, recursive (i) obtaining of the set of parameters and (ii) estimation of the OCV, the capacity, and the impedance.

6. The method of claim 5, wherein estimating the SOC based on the estimated OCV includes utilizing an OCV-SOC curve model, and wherein the function is a ratio of (i) change in OCV to (ii) change in SOC.

7. The method of claim 2, wherein estimating each of the OCV, the capacity, and the impedance based on the measured voltage, the set of parameters, and the corrected measured current further includes:
   performing, at the controller, an LDL factorization to increase the accuracy of each respective estimation algorithm; and
   utilizing, at the controller, each respective LDL factorized estimation algorithm with the measured voltage, the set of parameters, and the corrected measured current to obtain the estimated OCV, the estimated capacity, and the estimated impedance.

8. The method of claim 7, wherein each respective estimation algorithm is one of (i) a recursive least squares (RLS) adaptive filter algorithm, (ii) a Kalman filter (KF) algorithm, and (iii) an extended KF (EKF) algorithm.

9. The method of claim 1, further comprising applying, at the controller, predetermined constraints or ranges to the values of the set of parameters for the battery system.

10. The method of claim 1, wherein at least some of the set of parameters are different for charging and discharging of the battery system.

11. An electrified vehicle, comprising:
   an electric motor configured to propel the electrified vehicle;
   a battery system configured to power the electric motor;
   a current sensor configured to measure a current of the battery system; and
   a controller configured to:
      receive the measured current from the current sensor;
      receive a measured voltage of the battery system and a measured temperature of the battery system;

obtain a set of parameters for an equivalent circuit model of the battery system based on the measured current, voltage, and temperature, the set of parameters including at least one of resistance, capacitance, and capacity;
detect a low current period during which the measured current is less than a predetermined threshold and having a duration that is sufficiently long to provide a stable low current such that a current bias generated by the current sensor is assumed to be constant;
in response to detecting the low current period:
- convert the equivalent circuit model from a continuous-time domain to a discrete-time domain to obtain state-space matrices for the measured current, and
- apply a Kalman filter (KF) algorithm to the state-space matrices to estimate the current bias generated by the current sensor based on the measured voltage and the set of parameters;

adjust the measured current based on the estimated bias or offset of the current sensor to obtain a corrected measured current;
estimate an open circuit voltage (OCV) of the battery system based on the measured voltage, the set of parameters, and the corrected measured current;
estimate a state of charge (SOC) of the battery system based on the estimated OCV of the battery system; and
control at least one of the battery system and the electric motor based on the estimated SOC, thereby compensating for the estimated current bias generated by the current sensor and improving usage of the battery system.

12. The electrified vehicle of claim 11, wherein based on the measured voltage, the set of parameters, and the corrected measured current, the controller is further configured to estimate at least one of (i) a capacity of the battery system and (ii) an impedance of the battery system.

13. The electrified vehicle of claim 12, wherein the controller is further configured to estimate a state of health (SOH) of the battery system based on its capacity and its impedance.

14. The electrified vehicle of claim 13, wherein the controller is further configured to control at least one of the battery system and the electric motor based on at least one of the estimated SOC and the estimated SOH of the battery system.

* * * * *